United States Patent
Pfaffinger et al.

(10) Patent No.: US 11,395,448 B2
(45) Date of Patent: Jul. 19, 2022

(54) METHOD AND CONTROL DEVICE FOR THE THROUGHPUT-OPTIMIZED PRODUCTION OF PRINTED CIRCUIT BOARDS ON A PLURALITY OF PICK-AND-PLACE LINES

(71) Applicant: Siemens Aktiengesellschaft, Munich (DE)

(72) Inventors: Alexander Pfaffinger, Munich (DE); Christian Royer, Ottobrunn (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 128 days.

(21) Appl. No.: 16/498,840

(22) PCT Filed: Mar. 31, 2017

(86) PCT No.: PCT/EP2017/057713
§ 371 (c)(1),
(2) Date: Sep. 27, 2019

(87) PCT Pub. No.: WO2018/177538
PCT Pub. Date: Oct. 4, 2018

(65) Prior Publication Data
US 2020/0120839 A1    Apr. 16, 2020

(51) Int. Cl.
*H05K 13/04*    (2006.01)
*H05K 13/00*    (2006.01)
*H05K 13/08*    (2006.01)

(52) U.S. Cl.
CPC ..... *H05K 13/0404* (2013.01); *H05K 13/0015* (2013.01); *H05K 13/0061* (2013.01); *H05K 13/0452* (2013.01); *H05K 13/08* (2013.01)

(58) Field of Classification Search
CPC ........... H05K 13/0404; H05K 13/0015; H05K 13/0061; H05K 13/0452; H05K 13/08
See application file for complete search history.

(56) References Cited

U.S. PATENT DOCUMENTS

| | | | |
|---|---|---|---|
| 6,516,514 B1 * | 2/2003 | Pruefer | H05K 13/0495 29/840 |
| 10,165,720 B2 | 12/2018 | Ohashi | |

(Continued)

FOREIGN PATENT DOCUMENTS

| | | |
|---|---|---|
| CN | 1989795 A | 6/2007 |
| CN | 102356707 A | 2/2012 |

(Continued)

OTHER PUBLICATIONS

PCT International Search Report dated Jan. 2, 2018 and corresponding to PCT International Application No. PCT/EP2017/057713 filed on Mar. 31, 2017.

(Continued)

*Primary Examiner* — Peter Dungba Vo
*Assistant Examiner* — Jose K Abraham
(74) *Attorney, Agent, or Firm* — Schmeiser, Olsen & Watts LLP

(57) ABSTRACT

Provided is a method for the throughput-optimised production of printed circuit boards on least two assembly lines, wherein: the printed circuit boards are divided into clusters; each cluster is produced using a set-up system that is carried out by changeover tables that can be attached to the assembly line, each changeover table having at least one feed device for keeping ready stocks of components; and a changeover table set and an empty changeover table set comprises changeover tables with feed devices that are empty.

15 Claims, 2 Drawing Sheets

(56) References Cited

U.S. PATENT DOCUMENTS

Figure 1:
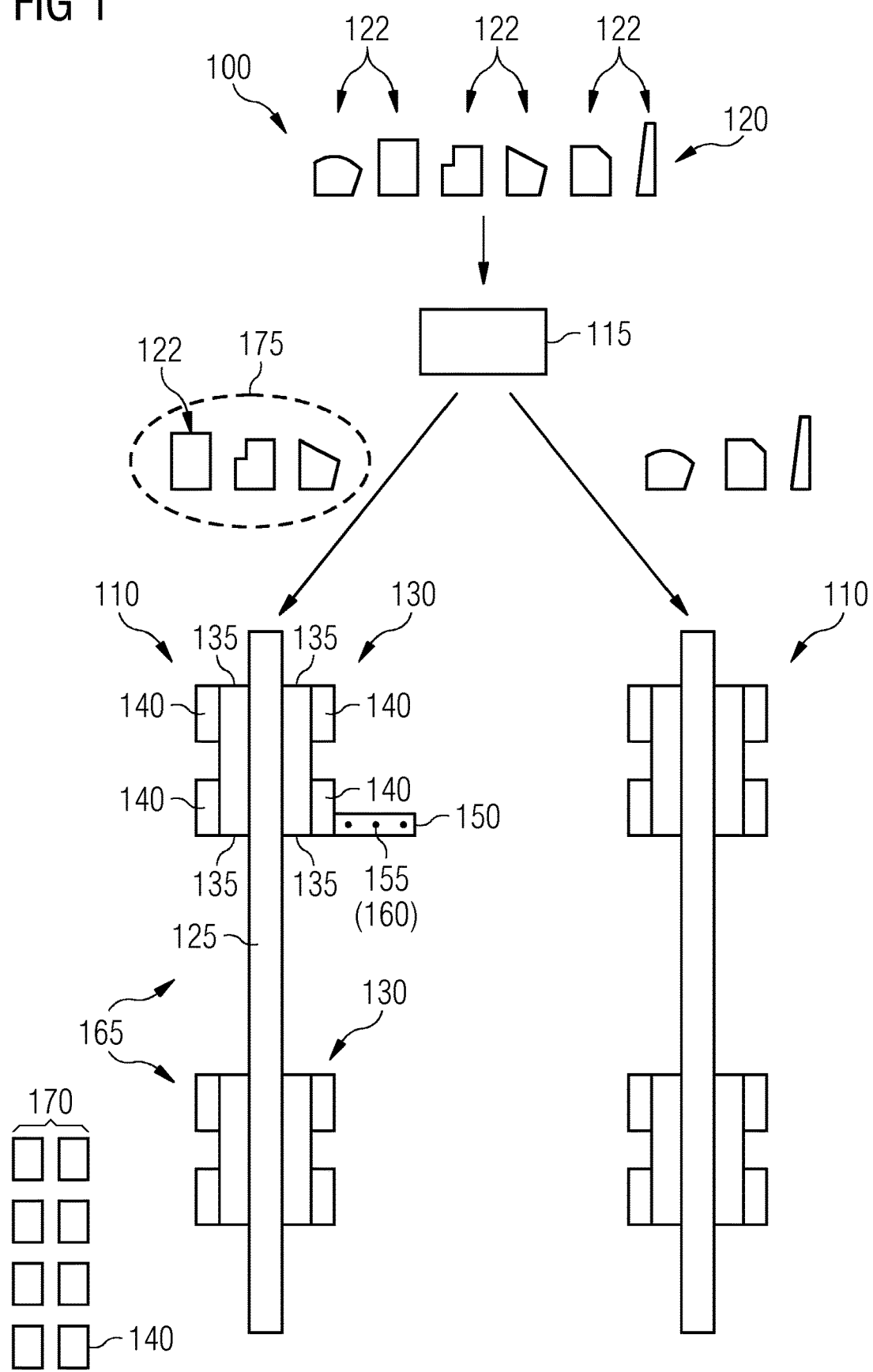

| | | | |
|---|---|---|---|
| 2004/0073322 A1* | 4/2004 | Maenishi | H05K 13/0853 700/28 |
| 2004/0143352 A1 | 7/2004 | Gyorfi et al. | |
| 2006/0047353 A1* | 3/2006 | Maenishi | H05K 13/0853 700/100 |
| 2007/0108109 A1* | 5/2007 | Erlandsson-Warvelin | G05B 19/4182 209/629 |
| 2008/0262642 A1 | 10/2008 | Maenishi et al. | |
| 2012/0004762 A1* | 1/2012 | Bauer | H05K 13/085 700/219 |
| 2012/0165972 A1* | 6/2012 | Wappling | B25J 9/1687 700/213 |
| 2015/0135505 A1 | 5/2015 | Royer | |
| 2015/0160648 A1* | 6/2015 | Craiovan | H05K 13/085 700/121 |
| 2015/0195965 A1 | 7/2015 | Craiovan et al. | |
| 2015/0195966 A1* | 7/2015 | Pfaffinger | H05K 13/08 700/121 |
| 2015/0296671 A1* | 10/2015 | Pfaffinger | H05K 13/08 29/830 |
| 2017/0311491 A1 | 10/2017 | Pfaffinger et al. | |
| 2017/0318716 A1 | 11/2017 | Dupont, Sr. | |

FOREIGN PATENT DOCUMENTS

| | | |
|---|---|---|
| CN | 104396362 A | 3/2015 |
| CN | 104412284 A | 3/2015 |
| CN | 105474768 A | 4/2016 |
| DE | 102012211810 A1 | 2/2014 |
| DE | 102014222936 A1 | 5/2016 |
| DE | 102014222940 A1 | 5/2016 |
| WO | 2014079601 A1 | 5/2014 |
| WO | 2018141356 A1 | 8/2018 |
| WO | WO 2018/141356 | 8/2018 |

OTHER PUBLICATIONS

Office Action in corresponding Chinese Patent Application No. 201780089362.4 dated May 27, 2020. 17 pages.

* cited by examiner

METHOD AND CONTROL DEVICE FOR THE THROUGHPUT-OPTIMIZED PRODUCTION OF PRINTED CIRCUIT BOARDS ON A PLURALITY OF PICK-AND-PLACE LINES

CROSS-REFERENCE TO RELATED APPLICATIONS

This application claims priority to PCT Application No. PCT/EP2017/057713, having a filing date of Mar. 31, 2017, the entire contents of which are hereby incorporated by reference.

FIELD OF TECHNOLOGY

The following relates to a method for the throughput-optimized production of printed circuit boards on a plurality of pick-and-place lines. Furthermore, the following relates to a control device for a pick-and-place system or a production or mounting line for the placement of components or devices on printed circuit boards (assemblies). Moreover, the following relates to a computer program product.

BACKGROUND

Particularly in the field of electronics production, printed circuit boards or assemblies to be produced are manufactured on SMT pick-and-place lines by surface mounting (surface mounted technology, SMT). One manufacturer of SMT pick-and-place machines and systems bearing the product name SIPLACE is for example ASM (http://www-.siplace.com/en/Home).

A plurality of pick-and-place machines which are usually connected by a transport system, and which interact e.g. in order to produce (electronics) devices or printed circuit boards, constitute a pick-and-place line.

In the case of pick-and-place machines e.g. for the placement of components on assemblies, shuttle tables for feed devices for components are arranged laterally at a transport path for the assembly.

The shuttle tables each comprise a multiplicity of feed devices. Each feed device keeps ready a supply of components of a predetermined component type. For the components, the feed device has a volumetric capacity (space capacity), which is usually expressed in tracks or track capacities.

Each feed device can be configured for keeping ready different components and different feed devices can usually be attached to a shuttle table. If a component of a component type that is not present in one of the shuttle tables is required at a specific pick-and-place machine, then it is usually the case that rather than one of the attached shuttle tables being provided with the required components, it is completely exchanged for another, appropriately equipped shuttle table. Equipping an exchangeable shuttle table with components is called prefitting and may require a processing time in the hours range.

Furthermore, it is known from electronics production, for example, to combine the batches to be produced on a pick-and-place line in fitting families. All batches of a fitting family are produced in each case with the same line fitting. A fitting family, also called cluster, comprises a set of batches which can be produced within a fitting. All assemblies of a fitting family can thus be produced successively without fitting conversion on the pick-and-place line.

A fitting can be held on one or a plurality of fitting tables that can easily be exchanged on the pick-and-place machine. However, equipping a fitting table with components of predetermined component types is complex—as already described above. The fittings are therefore often differentiated into fixed fittings and variant fittings, wherein a fixed fitting table is provided for maintaining its composition of component types over a predetermined planning time period, while a variant fitting table is expected to be converted within the planning time period.

Typical fitting operation on an SMT pick-and-place line within a short-term planning period, beginning at planning through to implementation, is manifested as follows:

The duration of a short-term planning time period is normally between one and five days. At the beginning of a planning period, the production planner usually acquires new production jobs from an EDP system. However, said planner also still has a remaining amount of old production jobs from the prior period that have not been scheduled in planning. The jobs are produced, if possible, with existing fixed fittings. Variable fittings (also called variant fittings) are created for the remainder.

While placement is being effected with an active fitting at the pick-and-place line, in the prefitting region the next fitting is already being prepared on a shuttle table set kept available for variable fittings. In this case, a quantity of shuttle tables required per fitting is referred to as a shuttle table set. If the preparation takes too long, then an outage time of the pick-and-place line arises.

Fitting conversion processes for changing the fitting from one fitting family to another fitting family also entail outage times of typically 30 min.

Outage times reduce the throughput on the pick-and-place lines and should thus absolutely be avoided.

In practice, the variable fittings are usually created using a cluster tool such as e.g. SiCluster. The fitting order that is ordered in a temporal sequence in the prefitting region is currently created manually by the production planner.

PCT/EP2017/051997 has already proposed a method and a control device for optimizing the throughput on a pick-and-place line.

SUMMARY

An aspect relates to optimize the throughput overall on a plurality of pick-and-place lines.

The embodiment of the invention include a method for the throughput-optimized production of printed circuit boards on at least two pick-and-place lines, wherein the printed circuit boards are divided into groups called clusters, wherein a cluster is produced in each case by means of a fitting, wherein the fitting is realized by shuttle tables which are attachable to the pick-and-place lines and which each have at least one feed device for keeping ready supplies of components, wherein a quantity of shuttle tables required per fitting is referred to as a shuttle table set and an empty shuttle table set has shuttle tables with feed devices that are empty, wherein a fitting is mounted temporarily on empty shuttle table sets and is demounted after the production of printed circuit boards as a result of the population thereof, and wherein one of the shuttle table sets is usable in production only if it has been completely equipped in a prefitting region, and the shuttle table set is equippable again only if production carried out with the shuttle table set has ended and the shuttle table set has been stripped again in the prefitting region, wherein the method comprises the following steps:

a) detecting a set of pick-and-place lines,
b) detecting a set of clusters,
c) detecting a number of empty shuttle table sets per pick-and-place line,
d) detecting the respective time duration for creating the fitting for one cluster per pick-and-place line,
e) detecting the respective production time duration for producing one cluster on one of the pick-and-place lines,
f) selecting an order for using the shuttle table sets per pick-and-place line for fitting in the prefitting region with the aim of avoiding waiting times in the production in which the same shuttle table sets are used for producing the printed circuit boards,
g) optimizing an assignment of clusters to the pick-and-place lines and an order of the assigned clusters per pick-and-place line, such that the throughput is maximized overall relative to all the pick-and-place lines,
h) carrying out the production of the printed circuit boards with the aid of the optimized assignment and order of the clusters.

An empty shuttle table set generally has shuttle tables that are not equipped or have not yet been equipped. In this case, the feed devices are empty and not equipped with components for placement.

The shuttle table sets can be assigned here in each case to positions in a temporal order in which the shuttle table sets are equipped in the prefitting region and are used or employed in the same temporal order in production.

The embodiment of the invention affords the advantage that the throughput in printed circuit board production can be increased. Optimum calculations for the abovementioned assignment to the pick-and-place lines and for the order are possible, as a result of which an automated assistance in production planning is also achieved, inter alia.

One development of the embodiment of the invention provides that in each case a maximum production time duration per pick-and-place line is definable or can be defined. This maximum production time duration can influence the above optimization.

One development of the embodiment of the invention provides that a subset of clusters which are not permitted to be produced or cannot be produced on a determinable or determined pick-and-place line of the pick-and-place lines is predefinable or determinable from the set of clusters.

One development of the embodiment of the invention provides the following further method steps:

detecting one or a plurality of earliest possible points in time for the beginning of the use of a shuttle table set per pick-and-place line,
detecting an earliest possible point in time per pick-and-place line for the beginning of production,
detecting an earliest possible point in time for the beginning of fitting in the prefitting region, and
optimizing the assignment and order of the clusters taking account of the earliest points in time detected.

It is thus possible to reduce the waiting time that arises owing to the fact that, for employing or using a shuttle table set in production, it is necessary to wait until the shuttle table set has been equipped to completion in the prefitting region.

One development of the embodiment of the invention provides for optimizing the assignment and the order of the clusters to be carried out with the aid of mixed integer linear optimization.

One development of the embodiment of the invention provides that clusters subdivided into real clusters and virtual clusters, also called filling or dummy clusters, influence the mixed integer linear optimization, wherein after optimizing the assignment and the order of the clusters (see above step g)), the virtual clusters are extracted or removed and the remaining clusters move up in the respective order. The virtual clusters are used for the linear optimization, are thus used as it were as a kind of placeholder, but do not correspond to real clusters.

On at least two pick-and-place lines it is possible to complete a number of real clusters with the real fittings thereof and also an identical number of virtual clusters with virtual fittings. Two shuttle table sets are normally available for completing the real clusters with the real fittings thereof. These clusters can be assigned to the respective pick-and-place lines and it is possible to design or define an order (1, 2, . . . , 5) for creating the respective fittings for the production of the corresponding cluster. Optimizing the assignment of the clusters and the order can be carried out iteratively by means of the abovementioned optimization procedure or method, in particular with the aid of mixed integer linear optimization.

One development of the embodiment of the invention provides that different types of fittings are used, wherein a first type corresponds to a fixed fitting, which, after one-off fitting, remains unchanged and is not demounted and mounted before production. One shuttle table set is provided per fixed fitting. A second type corresponds to a variant fitting, which is variable—as explained in the introduction. At least one shuttle table set is provided for the variant fittings. Each cluster is produced with a fitting of a predefinable type of the types mentioned.

One development of the embodiment of the invention provides that fitting conversion times are additionally detected and taken into account for the optimization, said times occurring as a result of changing the shuttle table sets upon the transition from one fitting to another fitting.

In order to improve the throughput, in production between the clusters with variant fittings it is possible skillfully to insert one or a plurality of clusters with fixed fittings therebetween.

One development of the embodiment of the invention provides that a cluster with a fixed fitting can be divided and can be introduced multiply into the order of the clusters.

Moreover, a cluster with a fixed fitting can be introduced at the beginning and/or at the end into the order of the clusters.

A further aspect of the embodiment of the invention provides a control device, in particular for carrying out the method for the throughput-optimized production of printed circuit boards on at least two pick-and-place lines as claimed in any of the preceding claims, wherein the printed circuit boards are divisible into groups called clusters, wherein a cluster is produced in each case by means of a fitting, wherein the fitting is realizable by shuttle tables which are attachable to the pick-and-place lines and which each have at least one feed device for keeping ready supplies of components, wherein a quantity of shuttle tables required per fitting is referred to as a shuttle table set and an empty shuttle table set has shuttle tables with feed devices that are empty, wherein a fitting is mountable temporarily on empty shuttle table sets and is demountable after the production of printed circuit boards as a result of the population thereof, and wherein one of the shuttle table sets is usable in production only if it has been completely equipped in a prefitting region, and the shuttle table set is equippable again only if production carried out with the shuttle table set has ended and the shuttle table set has been stripped again in the prefitting region, wherein the control unit comprises the following detection devices:

a) for detecting a set of pick-and-place lines,
b) for detecting a set of clusters,
c) for detecting a number of empty shuttle table sets,
d) for detecting the respective time duration for creating the fitting for one cluster per pick-and-place line,
e) for detecting the respective production time duration for producing one cluster on one of the pick-and-place lines,
f) for selecting an order for using the shuttle table sets per pick-and-place line for fitting in the prefitting region with the aim of avoiding waiting times in the production in which the same shuttle table sets are usable for producing the printed circuit boards, and
g) means for optimizing an assignment of clusters to the pick-and-place lines and an order of the assigned clusters per pick-and-place line, such that the throughput is maximized overall relative to all the pick-and-place lines, and also
h) means for carrying out the production of the printed circuit boards with the aid of the optimized assignment and order of the clusters.

The control device can provide means and/or units or devices and/or modules for carrying out the method mentioned above, each of which can be manifested in terms of hardware and/or in terms of firmware and/or in terms of software or as a computer program or a computer program product. These devices and/or means can be implemented individually by themselves or in a combined manner in one or more units.

The control device can be correspondingly developed like the method described above.

A further aspect of the embodiment of the invention can be a pick-and-place system comprising such a control device according to the embodiment of the invention.

Said pick-and-place system can be part of an installation.

The installation can be characterized, inter alia, by one of the following installation types. Examples thereof are an automation installation or a manufacturing or production installation.

A further aspect of the embodiment of the invention is a computer program product or a computer program comprising means for carrying out the abovementioned method when the computer program (product) is executed in a control device mentioned above or in means of the device. The computer program or computer program product can be stored on a computer-readable medium. The computer program or computer program product can be created using a customary programming language (e.g. C++, Java). The processing device can comprise a commercially available computer or server having corresponding input, output and storage means. This processing device can be integrated in the control device or in the means thereof.

BRIEF DESCRIPTION

Figure 2:
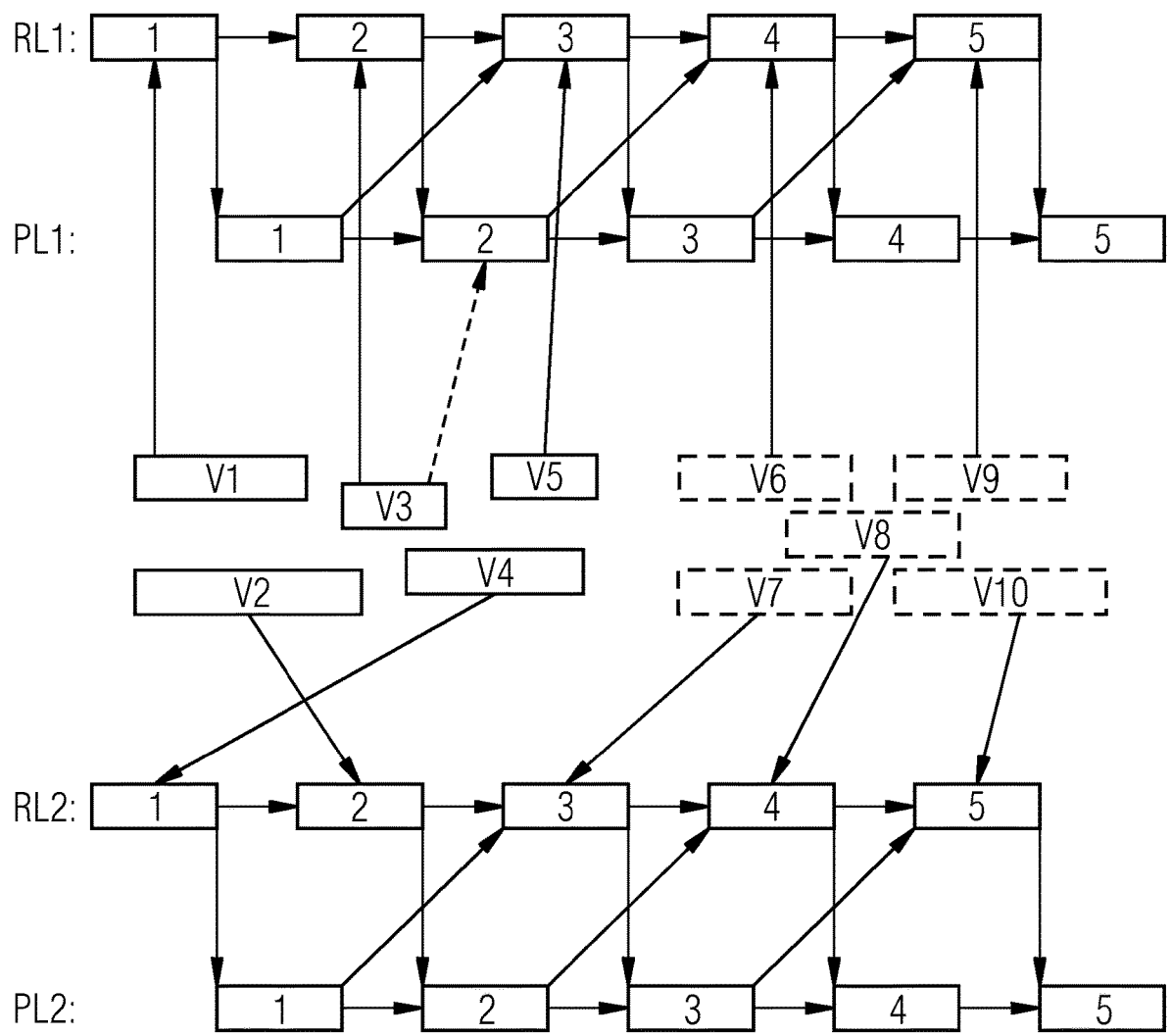

Some of the embodiments will be described in detail, with reference to the following figures, wherein like designations denote like members, wherein:

FIG. 1 shows a pick-and-place system by way of example comprising two pick-and-place lines, and FIG. 2 shows a graphical diagram showing the assignment to the pick-and-place lines and the order of the fitting processes in the prefitting region and the order of the use of the fittings in production.

DETAILED DESCRIPTION

FIG. 1 shows one exemplary pick-and-place system 100. The pick-and-place system 100 comprises a plurality of pick-and-place lines 110 and a processing or control device 115. Each pick-and-place line 110 comprises an optional transport system 125 and one or a plurality of pick-and-place machines 130. Each pick-and-place machine 130 comprises one or a plurality of pick-and-place heads 135, each configured to pick up components 155 from a fitting table 140 and to position them at a predetermined place on the printed circuit board 120 situated on the transport system 125. During the pick-and-place process, the printed circuit board 120 is usually stationary relative to the pick-and-place machine 130.

The fitting tables 140 each comprise a multiplicity of feed devices 150, only one of which is illustrated by way of example in FIG. 1. Each feed device 150 keeps ready a supply of components 155 of a predetermined component type 160. For the components 155, the feed device 150 usually has a volumetric capacity that can be expressed in tracks. A track is usually 8 mm wide and the number of tracks of a fitting table 140 is limited, for example to 40. Components 155 of the same component type 160 are usually provided in a belt, on a tray or in a tube. Each component type 160 requires a predetermined number of tracks on the feed device 150 and on the fitting table 140, which tracks usually adjoin one another.

A feed device 150 can usually be configured for keeping ready components 155 of different component types 160 and different feed devices 150 can usually be attached to a fitting table 140. In the present case, it is assumed as a simplification that a supply of components 155 of a component type 160 at a feed device 150 is practically infinite, that is to say that subsequent fitting is not necessary.

If a component 155 of a component type 160 that is not present on one of the fitting tables 140 is required at the pick-and-place machine 130, then it is usually the case that rather than the assignment of components 155 to one of the attached fitting tables 140 being altered, the fitting table 140 is completely exchanged for another, appropriately equipped fitting table 140. Equipping a fitting table 140 not attached to the pick-and-place line 110 with components 155 is called prefitting and may require a processing time in the range of one or more hours, for example approximately 6-8 hours.

Since a change of fitting tables 140 at the pick-and-place line 110, a so-called fitting change, is usually associated with a stoppage of production, it is endeavored to carry out changes of the fitting tables 140 as infrequently as possible. Furthermore, since the fitting tables 140 are costly and the fitting conversion of a fitting table 140 may be complex and lengthy, attempts are furthermore made to form the fewest possible fittings in order to produce a predetermined production quantity of printed circuit boards 120 of predetermined printed circuit board types 122. The production quantity here comprises a plurality of printed circuit board types 122, of which in each case a predetermined number of printed circuit boards 120 are intended to be populated with components 155 of predetermined component types 160. By way of example, 300 printed circuit boards 120 of a first printed circuit board type 122 and 200 printed circuit boards 120 of a second printed circuit board type 122 can be populated.

A fitting 165, 170 comprises a set of component types 160 and is realized by one or a plurality of fitting tables 140, which, in the case of a plurality of fitting tables, form a shuttle table set and in each case are equipped with supplies of components 155 of the component types 160 of the fitting 165, 170 and are attached to the pick-and-place line 110.

The fitting 165, 170 is assigned a fitting family 175 comprising printed circuit board types 122, of which printed circuit boards 120 can be populated by means of components 155 of the component types 160 of the fitting 165, 170. A fitting family 175 is assigned to exactly one fitting 165, 170, and vice versa.

In order to increase the capacity utilization of a pick-and-place line 110 or to reduce a need for fitting tables 140, it is therefore crucial how fitting families 175 are formed on the basis of the printed circuit board types 122 to be populated. When forming fittings 165, 170 or fitting families 175, constraints may need to be observed, for example compliance with a limited volumetric capacity of a fitting table 140 for component types 160 or a grouping of predetermined printed circuit board types 160 in the same fitting family 175, for instance for reasons of using lead-containing or lead-free soldering tin.

The fittings can be differentiated into fixed fittings 165 and variant fittings 170, wherein a fixed fitting 165 is provided so as to remain fitted without being changed on a number of shuttle tables 140 over a predetermined planning time period, while a shuttle table 140 of a variant fitting 170 is expected to be converted by being fitted with components 155 of other component types 160 within the planning time period. The planning time period may be 6 to 12 months, for example. A variant fitting 165 exists in a predetermined configuration usually for significantly less time than the planning time period, for example over a number of hours or days, but usually not over more than a week.

The fittings 165, 170 can be exchanged as required at the pick-and-place line 110. In order to realize a fixed fitting 165 or a variant fitting 170, usually a fitting table 140, while it is not attached to the pick-and-place line 110, is equipped with supplies of components 155 of predetermined component types 160. Already mounted components 155 of unrequired component types 160 can be demounted beforehand. This fitting conversion may comprise a considerable proportion of manual work and be time-consuming.

In order to minimize the outlay associated with a variant fitting 170, attempts are made to include as many printed circuit board types 122 as possible in the fixed fittings 165. A case without variant fittings 170 that is striven for is virtually unattainable, however, in practice.

In the context of the control of the pick-and-place system 100, the control device 115 assigns printed circuit board types 122, the assigned printed circuit boards 120 of which are intended to be populated on the pick-and-place line 110, respectively to a fitting family 175, wherein fixed-fitting fitting families 175 respectively assigned to a fixed fitting 165 and variant-fitting fitting families 175 respectively assigned to a variant fitting 170 can be formed.

A special case of optimization methods is linear optimization. It is concerned with the optimization of linear target functions over a set limited by linear equations and inequalities. It is the basis of the solution procedures of (mixed) integer linear optimization. A so-called solver is a collective term for specific mathematical computer programs which can solve mathematical problems numerically. In association with MILP (mixed integer linear programming), standard solvers such as e.g. CPLEX, Scip, Gurobi, Xpress can be used for IP programs (integer optimization models).

A description is given below of an example in which an MILP model (mixed integer linear programming) is used to calculate optimum assignment to the pick-and-place lines 110 and the temporal fitting orders of predefined fitting families to be produced. Moreover, it is possible to calculate an optimum temporal order for the use of the equipped shuttle table sets (variant fitting) and, if appropriate, the fixed-fitting shuttle table sets at the respective pick-and-place line.

FIG. 2 schematically illustrates the following:

In the first two rows with respect to a first pick-and-place line 110, positions 1, 2, . . . , 5 etc. are shown in a specific temporal order. In the prefitting region there is a fitting order RL1 with fitting positions. In the example, the variable or variant fittings V1, V3 and V5 are assigned here to the positions 1, 2 and 3 within the order RL1. If there are five clusters with variable fittings, as in the example, then there are also five positions (1, 2, 3, 4 and 5) within the fitting order to which the variable fittings are assigned or allocated (one to one). A certain number of shuttle table sets are available for creating these clusters with the variable fittings. There are usually two such shuttle table sets per pick-and-place line. One of the two shuttle table sets is available at the pick-and-place line after having been equipped. The other shuttle table set of the two shuttle table sets is situated in the prefitting region. The shuttle table sets are alternately assigned to the positions in advance, wherein the assignment begins with the shuttle table set available at the earliest point in time. The shuttle table sets are then used in production in the same temporal order 1, 2, . . . , 5 etc. in which they were equipped to completion. This is indicated by the arrows between the two rows, which represent waiting relationships among the positions 1 to 5. To put it another way, a shuttle table set must e.g. first be equipped to completion at position 1 before it can be used in production at position 1.

Clusters with variant fittings V1 to V5 are illustrated in the third row. The arrows between the first two rows and the third row indicate assignments of variant fittings to the positions 1 to 5. It may be expedient e.g. to position the variant fitting V3 at position 1 and the variant fitting V1 at position 2 if the fitting time (duration) for V3 is shorter than that for V1. Unnecessary waiting times or outage times in production would thus be avoided.

For each pick-and-place line, the number of positions corresponds exactly to the number of real fitting families to be produced overall. With respect to the fitting families that are really to be produced, there are also n virtual fitting families (n=number of positions overall minus the number of real fitting families) with fitting and production time durations having a magnitude of 0. The variant fittings for the real fitting families or clusters and the virtual fittings are assigned to the positions 1, 2, . . . , 5 etc. of the production orders PL1 and PL2, respectively, of the pick-and-place lines.

In the last two rows with respect to a second pick-and-place line, positions 1, 2, . . . , 5 etc. are likewise shown in a specific temporal sequence. In the prefitting region there is a fitting order RL2 with fitting positions. In the example, the variable or variant fittings V4 and V2 assigned here to the positions 1 and 2 within the fitting order RL2. If, as in the example, there are also additionally 5 virtual fittings V6, V7, V8, V9, V10 and for each pick-and-place line 5 positions (1, 2, 3, 4 and 5) within the fitting order, to which all the fittings V1 to V10 are assigned or allocated one to one, in the example the virtual fittings V6 and V9 are placed at the positions 4 and 5 of the fitting order RL1 and the virtual fittings V7, V8 and V10 are placed at the positions 3, 4 and 5 of the fitting order RL2. This placed order can be regarded as a starting selection, which is optimized in the optimization model explained below together with an initial assignment of clusters to the two pick-and-place lines on which they are produced in each case with a variant and/or fixed fitting created to completion beforehand.

Ultimately, the production of the printed circuit boards 120 is carried out physically with the attained optimized assignment and order of the clusters, wherein the virtual fittings are represented as it were as "placeholders" in the optimization model described in greater detail below. In this regard, the real fittings move up in the order during the real prefitting and in real production.

The maximum production time duration per pick-and-place line can additionally be defined. This maximum production time duration can influence the above optimization.

A subset of clusters which are not permitted to be produced or cannot be produced on a determinable or determined pick-and-place line of the pick-and-place lines can be determined from the set of clusters. This ultimately also influences the use of the variant fittings at the respective pick-and-place line.

Furthermore, it is possible for fixed fittings to be interposed into the production of the clusters. By way of example, the variant fitting V3 in the example could be a fixed fitting which is fixedly fitted onto a shuttle table set. Possibly no waiting times then arise for the clusters with fixed fittings, since the fixed fittings are mounted only once and are then in return maintained for a longer "planning" time period. The dashed arrow indicates this. Fixed fittings can be inserted or interposed into the production order PL1, for example, at "intermediate positions". This affords the advantage that waiting times in production for the completion of the variant fittings required can be avoided in this way. Fixed fittings are preferably used at the beginning and/or at the end of the production order.

In the following MILP model, a number of clusters with real fittings and a number of clusters with virtual fittings (=number of lines*number of real clusters−number of real clusters) are assigned to at least two pick-and-place lines.

In the formulation of the optimization model in the form of an MILP model, the following designations are applicable:

Indices:
L Set of pick-and-place lines
V Set of variable fitting families or clusters (real and dummy fitting families)
$P^l$ Set of order positions for the variable fitting families, $P^l = \{1, \ldots, |V|\}$ on pick-and-place line $l \in L$
$T^l$ Set of shuttle table sets on pick-and-place line $l \in L$
$P_s^l$ Ascending sorted set of positions at which shuttle table set $s \in T^l$ is used
$PTime_r^l$ Production time duration of fitting family r including the fitting conversion time duration at the pick-and-place line l
$RTime_r^l$ Tim duration for creating the fitting for the fitting family r at the pick-and-place line l
$EarliestBegin_L^l$ Earliest possible beginning of production at the pick-and-place line l
$EarliestBegin_R^l$ Earliest possible beginning of fitting in the prefitting region of pick-and-place line l
$EarliestBegin_s^l$ Earliest possible use for shuttle table set $s \in T^l$ on pick-and-place line l Binary Variables:
$assign_{v,p}^l$ Variable indicating whether the fitting family V is produced at the p-th position of the production order of the pick-and-place line l.
(In this case, it assumes the value 1, otherwise the value 0)
$beginP_p^l$ Beginning of the production of the fitting family at the p-th position of the production order of the pick-and-place line l
$beginV_p^l$ Beginning of the fitting creation for the fitting family at the p-th position of the fitting order for the pick-and-place line l
$endP_p^l$ End of the production of the fitting family at the p-th position of the production order of the pick-and-place line l
$endV_p^l$ End of the fitting creation for the fitting family at the p-th position of the fitting order for the pick-and-place line l IP Formulation:
The Target Function Reads:
Minimize $$\sum_{l \in L} end_{|P^l|}^l$$

Constraints:
(1) Each fitting family must be assigned to one position at a pick-and-place line.

$$\sum_{l \in L} \sum_{p \in P^l} assign_{v,p}^l = 1, v \in V$$

(2) Each position must be allocated one fitting family.

$$\sum_{v \in V} assign_{v,p}^l = 1 \; l \in L, p \in P^l$$

(3) The production of a fitting family at position p of a pick-and-place line l can only begin if the fitting has been created in the prefitting region.

$$endV_p^l \leq beginP_p^l \; l \in L, p \in P^l$$

(4) The creation of the fitting for the fitting family at position p of a pick-and-place line can only begin if the creation of the fitting of the fitting family at the position p−1 has concluded.

(5) At pick-and-place line l, the fitting creation for the fitting family at the p-th position can only begin if the allocated shuttle table set is free or empty.

$$endP_{p'}^l \leq beginV_{p_{direct\;successor\;of}}^l \; p' \text{ in } P_s^l, s \in T^l$$

(6) Taking account of the production time durations $$endP_p^l = beginP_p^l + \sum_{v \in V} PTime_r^l assign_{v,p}^l \; l \in L, p \in P^l$$

(7) Taking account of the fitting time durations in the prefitting region $$endV_p^l = beginV_p^l + \sum_{v \in V} RTime_v^l assign_{v,p}^l \quad l \in L, p \in P^l$$

(8) The production of a fitting family at position p at a pick-and-place line l can only begin if the production of the fitting family at the position p−1 has concluded.

$$endP_{p-1}^l \leq beginP_p^l \quad l \in L, p = 2, \ldots, |P^l|$$

(9) The production at the pick-and-place line can initially only begin if the pick-and-place line is available for this purpose.

$$EarliestBegin_L^l \leq beginP_1^l \quad l \in L$$

(10) The fitting creation in the prefitting region can initially only begin if the pick-and-place line is available for this purpose.

$$EarliestBegin_V^l \leq beginV_1^l \quad l \in L$$

(11) The shuttle table set s∈T$^l$ can initially only be used if it is available.

$$EarliestBegin_s^l \leq beginV_p^l \quad l \in L, s \in T^l, p_{first\ element} \text{ in } P_s^l$$

(12) Variable restrictions $$assign_{v,p}^l \in \{0, 1\} \quad l \in L, v \in V, p \in P^l$$
$$beginP_p^l \geq 0 \quad l \in L, p \in P^l$$
$$beginV_p^l \geq 0 \quad l \in L, p \in P^l$$
$$endP_p^l \geq 0 \quad l \in L, p \in P^l$$
$$endV_p^l \geq 0 \quad l \in L, p \in P^l$$

Extensions or Supplementations:

a) Upper production time duration limits at the pick-and-place lines

If the production time duration at a pick-and-place line is limited, e.g. because production in its entirety is permitted to have a maximum duration of one day, and if MaxP$^l$ is the upper production time duration limit of a pick-and-place line l, then this can be concomitantly included in the model with the following restrictions:

$$endP_{|P^l|}^l \leq MaxP^l \quad l \in L$$

b) Line restrictions of fitting families

If a fitting family v is not permitted to be produced on certain pick-and-place lines ForbiddenLines$_v \subset L$, then the following restrictions can be concomitantly included in the model:

$$\sum_{p \in P^l} assign_{v,p}^l = 0 \quad v \in V, l \in ForbiddenLines_v$$

c) Limitation of the number of fitting families (maxCluster) at one or more pick-and-place lines If the number of fitting families on a pick-and-place line is intended to be limited to a number maxCluster$^l$, then only maxCluster$^l$ positions are made available for this pick-and-place line (P$^l$={1, . . . , maxCluster$^l$}). The number of dummy pick-and-place lines then decreases accordingly.

The run-time performance can also be improved with such limitations.

d) Taking account of fixed fittings

Fixed fittings and the fitting families associated therewith can also be integrated into this MILP approach as in the patent application PCT/EP2017/051997 cited in the introduction. They can be used as a buffer between the variant fittings in order to avoid outage times owing to excessively long time durations for the fitting creation.

The following extensions associated therewith are likewise possible:

Taking account of "absent" fitting conversion times

If the last fitting produced before the planning time period is a fixed fitting f' and if this fixed fitting must likewise be produced in the planning time period to be optimized, then the fitting conversion time for this fixed fitting can be saved if the latter is produced first.

Preferably fixed fitting at the end

For the reason described in (1) it is expedient to produce a fixed fitting at the end. For this purpose, a target function component with a small weighting can be concomitantly included in the minimization target function.

Possible division of a fixed fitting

If waiting times occur in the optimum solution of the model, then they can possibly be avoided if permission is given that a fixed-fitting fitting family is not produced in one piece, but rather can be divided into a plurality of parts, each of which can then be used as a buffer between variant fittings. A corresponding fitting conversion time then arises for each part of the fixed-fitting fitting family.

By minimizing the turnaround time (duration), it is possible to improve or optimize the throughput overall at a plurality of pick-and-place lines. The production of the printed circuit boards is ultimately carried out with the aid of the above optimized assignment to the respective pick-and-place lines and optimized order.

The example explained with regard to FIG. 2 is a simplified model. The optimization problems are more complex in reality. In order to solve complex optimization problems, it is possible to use such MILP models of the type explained above.

Although the embodiment of the invention has been more specifically illustrated and described in detail by means of the preferred exemplary embodiment, nevertheless the embodiment of the invention is not restricted by the examples disclosed and other variations can be derived therefrom by the person skilled in the art, without departing from the scope of protection of the embodiment of the invention.

The implementation of the processes or method sequences described above can be effected on the basis of instructions present on computer-readable storage media or in volatile computer memories (referred to in combination hereinafter as computer-readable memories). Computer-readable memories are for example volatile memories such as caches, buffers, or RAM and nonvolatile memories such as exchangeable data carriers, hard disks, etc.

The functions or steps described above can be present here in the form of at least one instruction set in/on a computer-readable memory. In this case, the functions or steps are not tied to a specific instruction set or to a specific form of instruction sets or to a specific storage medium or to a specific processor or to specific execution schemes and can be implemented by software, firmware, microcode, hardware, processors, integrated circuits, etc. in standalone operation or in arbitrary combination. In this case, a wide variety of processing strategies can be employed, for example serial processing by a single processor or multiprocessing or multitasking or parallel processing, etc.

The instructions can be stored in local memories, but it is also possible to store the instructions on a remote system and access them via a network.

The term "processor", "central signal processing", "control unit" or "data evaluation means", as used here, encompasses processing means in the broadest sense, that is to say, for example, servers, general purpose processors, graphics processing units, digital signal processors, application-specific integrated circuits (ASICs), programmable logic circuits such as FGPAs, discrete analogue or digital circuits and arbitrary combinations thereof, including all other processing means that are known to the person skilled in the art or will be developed in the future. In this case, processors can consist of one or a plurality of apparatuses or devices or units. If a processor consists of a plurality of apparatuses, the latter can be designed or configured for the parallel or sequential processing or execution of instructions.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A method for a throughput-optimized production of printed circuit boards on at least two pick-and-place lines, wherein the printed circuit boards are divided into clusters, wherein a cluster is produced in each case by means of a fitting, wherein the fitting is realized by shuttle tables which are attachable to the pick-and-place lines and which each have at least one feed device for keeping ready supplies of components, wherein a plurality of shuttle table sets are used and an empty shuttle table set has shuttle tables with feed devices that are empty, wherein the fitting is mounted temporarily on the empty shuttle table set and is demounted after the production of printed circuit boards as a result of the population thereof, and wherein one of the shuttle table sets is usable in production only if the shuttle table set has been completely equipped in a prefitting region, and the shuttle table set is equippable again only if production carried out with the shuttle table set has ended and the shuttle table set has been prepared again in the prefitting region, wherein the method comprises:
a) identifying a set of pick-and-place lines;
b) identifying a set of clusters;
c) identifying a number of empty shuttle table sets per pick-and-place line;
d) estimating a respective time duration for creating the fitting for one cluster per pick-and-place line;
e) estimating a respective production time duration for producing one cluster on one of the pick-and-place lines;
f) selecting a production order for using the shuttle table sets per pick-and-place line for fitting in the prefitting region to avoid waiting times in the production in which the same shuttle table sets are used for producing the printed circuit boards, wherein a number of positions corresponds exactly to a number of real fitting families and each position is assigned to a respective fitting family;
g) optimizing an assignment of clusters to the pick-and-place lines and an order of the assigned clusters per pick-and-place line, such that the throughput is maximized overall relative to all the pick-and-place lines; and
h) carrying out the production of the printed circuit boards with the aid of the optimized assignment and order of the clusters.

2. The method as claimed in claim 1, wherein in each case a maximum production time duration per pick-and-place line is determinable.

3. The method as claimed in claim 1, wherein a maximum number of clusters in each case on a pick-and-place line is determinable, which clusters can be produced on the respective pick-and-place line.

4. The method as claimed in claim 1, wherein a subset of clusters which are not permitted to be produced on a determinable pick-and-place line of the pick-and-place lines is determinable from the set of clusters.

5. The method as claimed in claim 1, wherein the following steps are furthermore carried out:

estimating one or a plurality of earliest possible points in time for the beginning of the use of a shuttle table set per pick-and-place line, identifying an earliest possible point in time per pick-and-place line for the beginning of production, identifying an earliest possible point in time per pick-and-place line for the beginning of fitting in the prefitting region, and optimizing the assignment and order of the clusters taking in account of the earliest points in time estimated.

6. The method as claimed in claim 1, wherein optimizing the assignment and the order of the clusters is carried out with mixed integer linear optimization.

7. The method as claimed in claim 5, wherein after optimizing the assignment and the order of the clusters, the virtual clusters are removed and the remaining clusters move up in respective order.

8. The method as claimed in claim 1, wherein different types of fittings are used, wherein a first type corresponds to a fixed fitting, which, after one-off fitting, remains unchanged and is not demounted and mounted before production, and one shuttle table set is provided per fixed fitting, wherein a second type corresponds to a variant fitting, which is variable in accordance with at least one shuttle table set is provided for the variant fittings and wherein each cluster is produced with a fitting of a predetermined type.

9. The method as claimed in claim 1, wherein fitting conversion times are additionally detected and taken into account for the optimization, said fitting conversion times occurring as a result of changing the shuttle table sets upon the transition from one fitting to another fitting.

10. The method as claimed in claim 1, wherein a cluster with a fixed fitting can be divided and can be introduced separately into the order of the clusters.

11. A control device, for the throughput-optimized production of printed circuit boards on at least two pick-and-place lines, wherein the printed circuit boards are divisible into groups called clusters, wherein a cluster is produced in each case by means of a fitting, wherein the fitting is realizable by shuttle tables which are attachable to the pick-and-place lines and which each have at least one feed device for keeping ready supplies of components, wherein a quantity of shuttle tables required per fitting is referred to as a shuttle table set and an empty shuttle table set has shuttle tables with feed devices that are empty, wherein the fitting is mountable temporarily on an empty shuttle table set and is demountable after the production of printed circuit boards as a result of the population thereof, and wherein one of the shuttle table sets is usable in production only if it has been completely equipped in a prefitting region, and the shuttle table set is equippable again only if production carried out with the shuttle table set has ended and the shuttle table set has been prepared again in the prefitting region, wherein the control device is configured to:

a) identify a set of pick-and-place lines,
b) identify a set of clusters,
c) identify a number of empty shuttle table sets,
d) estimate a respective time duration for creating the fitting for one cluster per pick-and-place line,
e) estimate a respective production time duration for producing one cluster on one of the pick-and-place lines, f) select a production order for using the shuttle table sets per pick-and-place line for fitting in the prefitting region with the aim of avoiding waiting times in the production in which the same shuttle table sets are usable for producing the printed circuit boards, wherein the number of positions corresponds exactly to the number of real fitting families and each position is assigned to a respective fitting family, and g) optimize an assignment of clusters to the pick-and-place lines and an order of the assigned clusters per pick-and-place line, such that the throughput is maximized overall relative to all the pick-and-place lines, and also h) produce the printed circuit boards with the aid of the optimized assignment and order of the clusters.

12. The control device as claimed in claim 11, wherein optimizing the assignment and the order of the clusters is able to be carried out with the aid of mixed integer linear optimization.

13. The control device as claimed claim 12, wherein clusters subdivided into real clusters and virtual clusters influence the mixed integer linear optimization, wherein the mixed integer optimization is designed so as, after optimizing the assignment and the order of the clusters, to extract the virtual clusters and to move up the remaining clusters in respective order.

14. The control device as claimed in claim 11, wherein different types of fittings are usable, wherein a first type corresponds to a fixed fitting, which, after one-off fitting, remains unchanged and is not demounted and mounted before production, and one shuttle table set is provided per fixed fitting, wherein a second type corresponds to a variant fitting, which is variable in and at least one shuttle table set is provided for the variant fittings and wherein each cluster can be produced with a fitting of a predefinable type.

15. A computer program product, comprising a computer readable hardware storage device having computer readable program code stored therein, said program code executable by a processor of a computer system to implement a method as claimed claim 1.

* * * * *